(12) United States Patent
Kandaswamy et al.

(10) Patent No.: US 11,146,456 B2
(45) Date of Patent: *Oct. 12, 2021

(54) FORMAL MODEL CHECKING BASED APPROACHES TO OPTIMIZED REALIZATIONS OF NETWORK FUNCTIONS IN MULTI-CLOUD ENVIRONMENTS

(71) Applicant: Cisco Technology, Inc., San Jose, CA (US)

(72) Inventors: Sridar Kandaswamy, San Jose, CA (US); Bob Melander, Sigtuna (SE)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/127,152

(22) Filed: Dec. 18, 2020

(65) Prior Publication Data

US 2021/0111965 A1 Apr. 15, 2021

Related U.S. Application Data

(63) Continuation of application No. 16/124,866, filed on Sep. 7, 2018, now Pat. No. 10,904,099.

(51) Int. Cl.
*H04L 12/24* (2006.01)
*G06F 30/3323* (2020.01)
(52) U.S. Cl.
CPC ........ *H04L 41/145* (2013.01); *G06F 30/3323* (2020.01); *H04L 41/0823* (2013.01); *H04L 41/12* (2013.01)
(58) Field of Classification Search
CPC ... H04L 41/12; H04L 41/0823; H04L 41/145; G06F 30/3323

(Continued)

(56) References Cited

U.S. PATENT DOCUMENTS 9,621,428 B1 4/2017 Lev et al.
9,800,465 B2 10/2017 Steinder et al.
(Continued)

OTHER PUBLICATIONS

Bhamare, et al., "Optimal Virtual Network Function Placement in Multi-Cloud Service Funcion Chaining Architecture", Computer Communications, vol. 102, Apr. 2017, 19 pages.

(Continued)

*Primary Examiner* — James E Springer
(74) *Attorney, Agent, or Firm* — Lee & Hayes, P.C.

(57) ABSTRACT

In an embodiment, a computer-implemented method comprises receiving logical model input that specifies a logical topology model of networking elements and/or computing elements for deployment at least partially in a private cloud computing infrastructure and at least partially in a public cloud computing infrastructure; receiving resource input specifying an inventory of computing elements that are available at least partially in the private cloud computing infrastructure and at least partially in the public cloud computing infrastructure; automatically generating an intermediate topology comprising a set of deployment instructions that are capable of execution at least partially in the private cloud computing infrastructure and at least partially in the public cloud computing infrastructure to cause physical realization of a network deployment corresponding to the logical topology model; determining whether the intermediate topology is functionally equivalent to the logical topology model; in response to determining that the intermediate topology is functionally equivalent to the logical topology model, transmitting the deployment instructions at least partially to the private cloud computing infrastructure and at least partially to the public cloud computing infrastructure.

19 Claims, 6 Drawing Sheets

(58) Field of Classification Search
USPC .......................................................... 709/223
See application file for complete search history.

(56) References Cited

U.S. PATENT DOCUMENTS

| | | | |
|---|---|---|---|
| 10,565,083 | B2 | 2/2020 | Mital et al. |
| 2003/0083858 | A1* | 5/2003 | Musliner ............. G06F 30/3323 703/22 |
| 2011/0161952 | A1 | 6/2011 | Poddar et al. |
| 2012/0011168 | A1 | 1/2012 | Tkachuk |
| 2012/0123898 | A1 | 5/2012 | Kirkeby et al. |
| 2012/0131591 | A1 | 5/2012 | Moorthi et al. |
| 2012/0179824 | A1 | 7/2012 | Jackson |
| 2014/0052773 | A1 | 2/2014 | Deng et al. |
| 2014/0278724 | A1 | 9/2014 | Compagna et al. |
| 2014/0280961 | A1 | 9/2014 | Martinez et al. |
| 2014/0280977 | A1* | 9/2014 | Martinez ............... G06F 11/324 709/226 |
| 2015/0163285 | A1 | 6/2015 | Chakra et al. |
| 2015/0180949 | A1 | 6/2015 | Maes et al. |
| 2016/0294922 | A1 | 10/2016 | Walls et al. |
| 2016/0323373 | A1* | 11/2016 | Bryant .................. H04L 47/781 |
| 2017/0006119 | A1 | 1/2017 | Pogrebinsky et al. |
| 2017/0063710 | A1 | 3/2017 | Smith et al. |
| 2017/0201569 | A1 | 7/2017 | Fu et al. |
| 2018/0152392 | A1 | 5/2018 | Reed et al. |
| 2018/0322558 | A1 | 11/2018 | Padmanabh et al. |
| 2019/0332518 | A1* | 10/2019 | Lukman .............. G06F 11/3632 |
| 2019/0377897 | A1 | 12/2019 | Griffin et al. |
| 2020/0084112 | A1 | 3/2020 | Kandaswamy et al. |
| 2020/0326990 | A1* | 10/2020 | Staffelbach ............ G06N 5/022 |

OTHER PUBLICATIONS

Flanagan, "Dynamic Partial-Order Reduction for Model Checking Software" POPL '05: Proceedings of the 32nd ACMu SIGPLAN-SIGACT symposium on Principles of programming languages https://dl .acm.org/doi/10.1145/1040305.1040315 (Year: 2005).

Non Final Office Action dated May 27, 2020 for U.S. Appl. No. 16/124,866, "Formal Model Checking Based Approaches to Optimized Realizations of Network Functions in Multi-Cloud Environments", 21 pages.

Non Final Office Action dated Jan. 6, 2020 for U.S. Appl. No. 16/124,866 "Formal Model Checking Based Approaches to Optimized Realizations of Network Functions in Multi-Cloud Environments" Kandaswamy, 15 pages.

Quinton, et al., "Towards Multi-Cloud Configurations Using Feature Models and Ontologies", 1st International Workshop on Multi-Cloud Applications and Federated Clouds, HAL archives-ouvertes. fr, 2013, 7 pages.

Springer Open, "A Constraints-Based Resource Discovery Model for Multi-provider Cloud Environments", Journal of Cloud Computing, Jun. 2012, 23 pages.

Wright, et al., "A constraints-based resource discovery model for multi-provider cloud environments", Journal of Cloud Computing: Advances, Systems and Applications, vol. 1, No. 6, 2012, pp. 1-14.

* cited by examiner

FORMAL MODEL CHECKING BASED APPROACHES TO OPTIMIZED REALIZATIONS OF NETWORK FUNCTIONS IN MULTI-CLOUD ENVIRONMENTS

RELATED APPLICATIONS

This application claims priority to and is a continuation of U.S. patent application Ser. No. 16/124,866, filed on Sep. 7, 2018, the entire contents of which are incorporated herein by reference.

FIELD OF THE DISCLOSURE

One technical field of the present disclosure is instantiating and configuring virtual machines, storage, and processing workload in virtualized computing environments such as datacenters and cloud computing services. Another technical field is validating logical models of network topologies using formal model checking prior to physically deploying computing resources to create a network.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Cloud computing is the practice of using a network of remote servers hosted on the internet to store, manage, and process data, rather than a local server or a personal computer. Cloud networks commonly use deployment models for enterprises with a private cloud that is allocated exclusively for data processing for the enterprise, and a public cloud that is used to process data that is non-exclusive to the enterprise. This approach permits elasticity with respect to processing demand or to allow integration of specialized computational models.

Public cloud computing providers utilize multiple deployment models that enable a consumer to pick and choose services or applications to execute using public or private cloud resources depending on the level of sensitivity of the data. However, deployment of hybrid cloud networks can be complex and costly to maintain due to potential disparity in cloud environments, dynamic alterations to cloud networks, and the fact that management responsibilities are typically split between the private cloud provider enterprise and the public cloud provider. Thus, there is a need for enhanced generation of deployment models in order to be compatible with multi-cloud networks. Furthermore, there is a need for a system that allows for optimization of cloud components and regeneration and remapping of network topology that is compatible with the multi-cloud computing environment.

Templates of deployment models for network functions have been developed to help create cloud networks with consistent topology and uniform distribution of the functions across private and public clouds. However, the use of templates comes at a cost, especially when complex filters such as application layer classification are needed. Implementing these services requires special-purpose virtual network elements, yet the same functionality may be available in more traditional enterprise edge internetworking devices at lower cost. These problems are especially difficult in a multi-cloud scenario in which a single enterprise is using both public and private cloud networks.

SUMMARY

The appended claims may serve to summarize the disclosure.

DETAILED DESCRIPTION

In the following description, for the purposes of explanation, numerous specific details are set forth in order to provide a thorough understanding of the present embodiments. It will be apparent, however, that the present embodiments may be practiced without these specific details. In other instances, well-known structures and devices are shown in block diagram form in order to avoid unnecessarily obscuring the present embodiments. Embodiments are described in sections below according to the following outline:

1. General Overview
2. Structural and Functional Overview
3. Benefits of Certain Embodiments
4. Implementation Example—Hardware Overview

1. General Overview

Techniques for generating and validating deployment models which optimize network functions within multi-cloud environments, followed by physical deployment of the models using internetworking devices and virtual processing resources, are disclosed. Intent-based models are created, validated and then used for physical realization of multi-cloud topologies that are functionally equivalent to the models, even when the models do not specify both public and private cloud resources. Formal methods are used to validate the correctness of the logical model without the need for test-based verification.

In an embodiment, deployment generator instructions receive logical model input describing a prospective network topology. The deployment generation instructions automatically generate a physical network topology for a multi-cloud deployment, including a set of deployment instructions that can be transmitted from a first cloud gateway in a private cloud and a second cloud gateway in a public cloud. The physical network topology is subjected to formal model checking to determine whether it is functionally equivalent to the logical model input. Upon establishing functional equivalence between the logical model input and the physical topology that was generated, the deployment instructions are considered verified, and an actual realization of the generated topology can be triggered.

In an embodiment, optimizing network functions within multi-cloud environments comprises generating a network topology with the set of deployment instructions. The network topology is based on one or more constraints and one or more assets of a resource inventory that define what is possible for physical deployment. Once the network topology is generated, partial order reduction model checking is executed to verify the functional equivalence between the deployment instructions and the data model. If verification of the set of deployment instructions fails, then the logical model input can be corrected or re-entered to automatically generate a second set of deployment instructions. This process is repeated until functional equivalence is established between the network topology and the data model. Upon establishing functional equivalence, an actual realization of the network topology is triggered.

The specific contents of the resource inventory and deployment constraints may vary in various embodiments and are not critical to an embodiment. An example of a resource inventory is data specifying which cloud service providers are available or the types of virtual machine images that are available. Examples of constraints include the number of virtual machine instances that can be instantiated, limits on pricing or cost or minimum amounts of storage. The following table illustrates an example resource inventory and constraints model for selected network service instances:

| Provider | Network Service | Instance ID | Available Capacity | Weight |
|---|---|---|---|---|
| Pvt cloud SJC-001 | PHY-LB-VIPRION-4800 | SJC-001-LB-001 | 70% | 1 |
| Pvt cloud SJC-001 | PHY-LB-VIPRION-4800 | SJC-001-LB-002 | 100% | 1 |
| Pub Cloud AWS-VPC-005 | VIR-LB-ELB | AWS-VPC-005-001 | 20% | 0.5 |
| Pub Cloud AZU-VPC-003 | VIR-LB-STD-LB | AZU-VPC-003-001 | 80% | 0.7 |
| Pvt cloud STKHLM-002 | PHY-LB-VIPRION-4800 | STKHLM-002-LB-001 | 50% | 1 |
| Pvt cloud STKHLM-002 | VIR-LB-BIG-IP | STKHLM = 002-LB-002 | 70% | 0.8 |

Fields of the table have the following example labels and contents:

Provider: Specifies and instance of a Cloud (Private or Public) or Data Center that is a component of the entire Multi Cloud deployment. In this example there are six components with two Public Clouds and four Private (or Data Center) instances.

Network Services: Specifies an implementation (Physical or Virtual) of a particular Network Service. Load Balancer (LB) possibilities are shown, listing specific Physical Gear or Virtual implementations.

Instance ID: Specifies a particular instance of a Network Service. The example shows two instances labeled as SJC-001-LB-001 and SJC-001-LB-002 of an F5 Physical VIPRION LB.

Available Capacity: Specifies the capacity available for each of the network service instances. This is used for scheduling workloads.

Weight: Specifies the bias to be used in the scheduling of workloads. A simplistic view indicates a more favorable weight for instances deployed in the Private Cloud for better cost optimization over similar instances in Public Clouds.

In this illustrative example, the fields Provider, Network Services, Instance ID are representative of the resource inventory. The fields Available Capacity & Weight model the constraints. The constraints along with the resource inventory are inputs to the model checkers to yield optimized realization of the network services. The constraints are dynamically changing based on workload as well as other factors that can influence cost etc.

In one embodiment, the deployment generation instructions receive a plurality of instructions describing a prospective network topology from one or more processors. The prospective network topology accounts for at least one public cloud network associated with a public cloud network provider and at least one private cloud network associated with an enterprise. The enterprise comprises programs, service models, and applications which reside in an on-premise datacenter of the enterprise. Such programs, service models, and applications may include software-as-a-service (SaaS) programs, platform-as-a-service (PaaS) programs, infrastructure-as-a-service (IaaS) programs, Load Balancing-as-a-service (LBaaS) programs, application frontends, application backends, application classification programs, firewalls or others.

In an embodiment, a computer-implemented method comprises receiving logical model input that specifies a logical topology model of networking elements and/or computing elements for deployment at least partially in a private cloud computing infrastructure and at least partially in a public cloud computing infrastructure; receiving resource input specifying an inventory of computing elements that are available at least partially in the private cloud computing infrastructure and at least partially in the public cloud computing infrastructure; automatically generating an intermediate topology comprising a set of deployment instructions that are capable of execution at least partially in the private cloud computing infrastructure and at least partially in the public cloud computing infrastructure to cause physical realization of a network deployment corresponding to the logical topology model; determining whether the intermediate topology is functionally equivalent to the logical topology model; in response to determining that the intermediate topology is functionally equivalent to the logical topology model, transmitting the deployment instructions at least partially to the private cloud computing infrastructure and at least partially to the public cloud computing infrastructure; wherein the method is executed using one or more computing devices.

In one feature, partial order reduction model checking is used for model verification. In another feature, the method also involves receiving constraint input that specifies one or more constraints upon realization of the logical topology model in the private cloud computing infrastructure and in the public cloud computing infrastructure; optimizing the intermediate topology based upon the constraint input, including automatically remapping the intermediate topology to an optimized network topology by placing, in the private cloud computing infrastructure, at least one functional element of the public cloud infrastructure that the intermediate topology had placed in the public cloud computing infrastructure. In one approach, the constraint input specifies at least one attribute of the private cloud infrastructure and at least one attribute of the public cloud infrastructure.

In another feature, the method also comprises, in response to determining that the intermediate topology is not functionally equivalent to the logical topology model: receiving one or more of updated logical model input, updated resource input and updated constraint input; based on the one or more of updated logical model input, updated resource input and updated constraint input, automatically generating an updated intermediate topology; verifying whether the updated intermediate topology is functionally equivalent to the logical topology model; optimizing the intermediate topology based upon the constraint input, including automatically remapping the intermediate topology to an optimized network topology by placing, in the private cloud computing infrastructure, at least one functional element of the public cloud infrastructure that the intermediate topology had placed in the public cloud computing infrastructure. These steps may be repeated two or more times until the intermediate topology is functionally equivalent to the logical topology model.

In yet another feature, the method further comprises automatically generating the intermediate topology using at least two different public cloud adaptors that are programmed to generate the intermediate topology with at least two sets of instructions that correspond to at least two different technologies of two different cloud service providers that provide parts of the public cloud infrastructure.

2. Structural and Functional Overview

Figure 1:
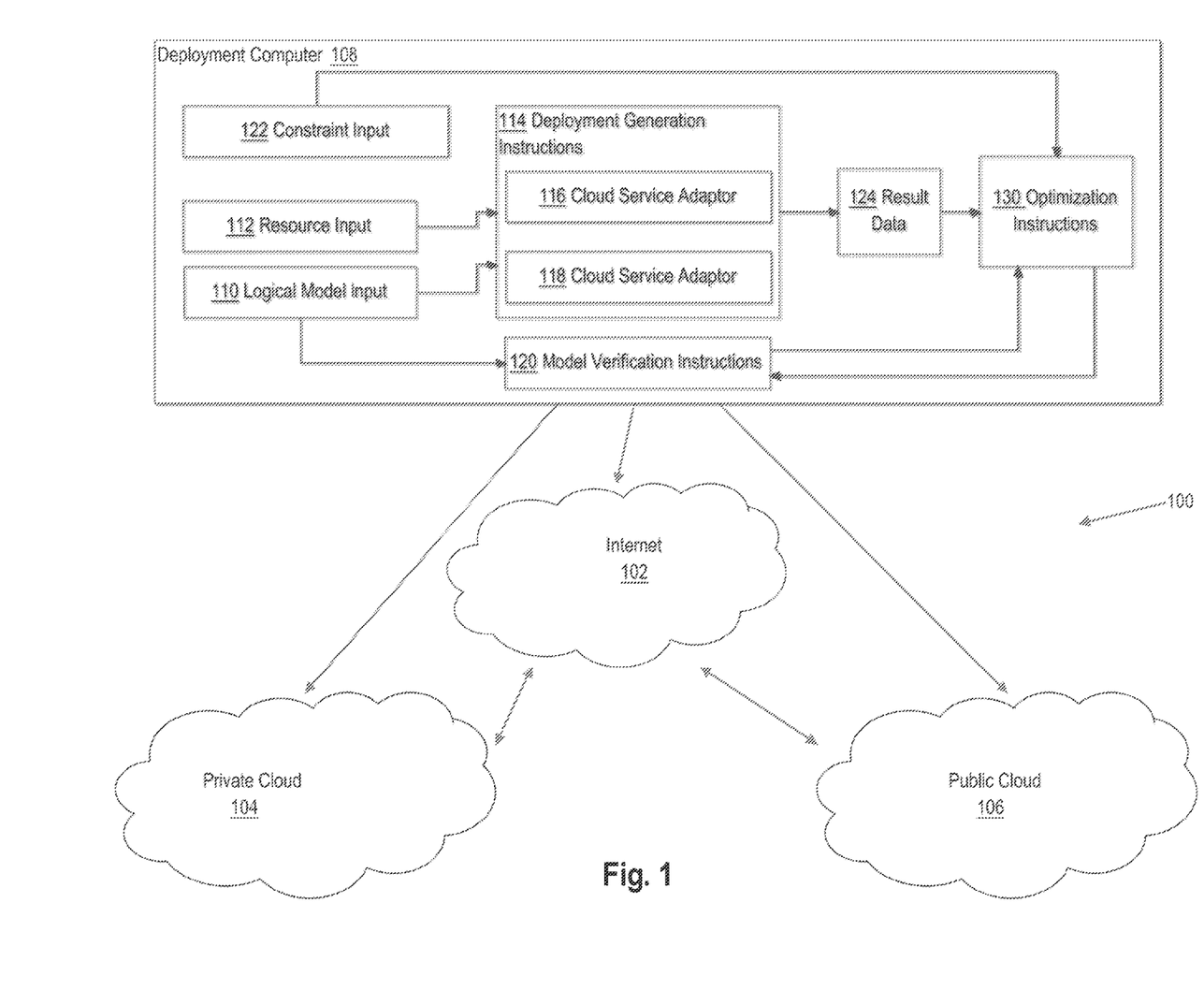
FIG. 1 illustrates a hypothetical cloud network.

FIG. 1 illustrates a computer system that may be used to implement an embodiment and connections to hypothetical a multi-cloud network. FIG. 1 is provided for the purpose of illustrating, at a schematic level, one possible set of functional elements and connections between an enterprise computing facility and multiple different kinds of cloud networks and cloud computing facilities.

In one embodiment, a deployment computer 108 that is coupled directly or indirectly to a multi-cloud network 100 that may comprise an internetwork or internet 102, a private cloud 104 and public cloud 106. The deployment computer 108 comprises components that are implemented at least partially by hardware at one or more computing devices, such as one or more hardware processors executing program instructions stored in one or more memories for performing the functions that are described herein. All functions described herein are intended to indicate operations that are performed using programming in a special-purpose computer or general-purpose computer, in various embodiments.

A "computer" may be one or more physical computers, virtual computers, and/or computing devices. As an example, a computer may be one or more server computers, cloud-based computers, cloud-based cluster of computers, virtual machine instances or virtual machine computing elements such as virtual processors, storage and memory, data centers, storage devices, desktop computers, laptop computers, mobile devices, computer network devices such as gateways, modems, routers, access points, switches, hubs, firewalls, and/or any other special-purpose computing devices. Any reference to "a computer" herein may mean one or more computers, unless expressly stated otherwise.

In an embodiment, as an overview, deployment computer 108 comprises deployment generation instructions 114, model verification instructions 120 and optimization instructions 130. Logical model input 110 describing a logical model of a network deployment is provided to the deployment generation instructions 114, and to the model verification instructions 120. Resource input 112 also is provided to the deployment generation instructions 114. Using one or more cloud service adaptors 116, 118, the deployment generation instructions 114 generate result data 124 which may comprise specific configuration instructions for resources in private cloud 104 and/or public cloud 106, or an enterprise network of which the deployment computer 108 may be a part. Cloud service adaptors 116, 118 may comprise executable code that causes generation of topologies specific to different technologies or services that are available only in specific different public cloud services. Examples include NMS or AWS, where NMS and AWS are two different cloud service providers each providing at least a portion of the public cloud infrastructure in which a topology could be deployed.

The result data 124 is provided as input to optimization instructions 130, which also receive constraint input 122 as input. The result data 124 is processed based on the constraint input 122 to remap the topology to an optimized version that attempts to fulfill as many constraints as possible that are represented in the constraint input. The resulting topology is verified for functional equivalence with the input model represented in logical model input 110. In an embodiment, model verification instructions 120 are programmed to implement partial order reduction techniques for verification.

The deployment generation instructions 114 are programmed or configured to generate a topology for a cloud or multi-cloud environment. Features that are possible to use in the cloud environment may be defined in the resource input 112, which may be derived from an inventory repository or inventory database, and the constraint input 112, which specifies one or more constraints on physical deployment of a topology represented in the logical model input 110. In an embodiment, the deployment generation instructions 114 uses the logical model input 110 and one or more assets of resource inventory specified in resource input 112 to generate the result data 124 as an intermediate network topology. The deployment generation instructions 114 use the intermediate network topology as a source for generating an optimized network topology that is influenced by the one or more constraints. Details of these functions are described further in other sections.

Resource inventory may include but is not limited to network devices within a cloud network, physical connectivity, virtual resources, service providers, regions, and access credentials. Resource input 112 also may specify processing workload parameters. Workload, in this context, is a representation of the amount of processing that a computer or server has been allocated at a given time and may consist of application programming within multi-cloud network 100. The workload parameters may be provided by a user or administrator via a graphical user interface, or may be programmatically queried, retrieved, obtained or derived from one or more computers or servers within multi-cloud network 100. For example, health monitors, system monitors or other network management elements executing in multi-cloud network 100 may store and manage metrics that specify CPU resources, CPU load, CPU processing requirements for one or more applications, or other values that can be programmatically queried or retrieved as part of the resource input 112.

The constraints may include but are not limited to placement of network functions within a cloud network, sensitivity level of data in a cloud network, capacity expectation of a cloud network, and data traffic expectations. Constraints can be provided by a user, an administrator, or other components within multi-cloud network 100. Additionally or alternatively, resource inventory and constraints may be obtained programmatically from files or configuration data that has been stored for other purposes in any of the elements of multi-cloud network 100. For example, network management computers within private cloud 104 or public cloud 106 may store or expose network element inventory data or constraints to API calls, parameterized URLs or other programmatic calls, and deployment computer 108 may be programmed to issue such calls to the private cloud or public cloud to obtain responses, objects or download files that contain inventory data and/or constraints.

Each of deployment generation instructions 114, model verification instructions 120 and optimization instructions 130 are executable program instructions and may comprise machine executable code in the instruction set of a CPU and may have been compiled based upon source code written in JAVA, C, C++, OBJECTIVE-C, or any other human-readable programming language or environment, alone or in combination with scripts in JAVASCRIPT, other scripting languages and other programming source text. In another embodiment, the programmed instructions also may represent one or more files or projects of source code that are digitally stored in a mass storage device such as non-volatile RAM or disk storage, in the systems of FIG. 1 or a separate repository system, which when compiled or interpreted cause generating executable instructions which when executed cause the computer to perform the functions or operations that are described herein with reference to those instructions.

Multi-cloud network 100 broadly represents any combination of one or more data communication networks including local area networks, wide area networks, internetworks or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. Private cloud network 104, public cloud network 106, deployment computer 108, and other elements of the system may each comprise an interface compatible with multi-cloud network 100 and are programmed or configured to use standardized protocols for communication across the networks such as TCP/IP, Bluetooth, and higher-layer protocols such as HTTP, TLS, and the like.

Multi-cloud network 100 may be implemented using a server-class computer or other computers having one or more processor cores, co-processors, or other computers. Multi-cloud network 100 may be a physical server computer and/or a virtual server instance stored in a data center, such as through cloud computing. Additionally or alternatively, multi-cloud network 100, private cloud network 104, and public cloud network 106 may comprise one or more applications executing on a server computer system which comprises instructions for application modeling and appliance/hardware mapping. Multi-cloud network 100 further comprises one or more network policies using notions such as templates or profiles that can be applied to different points in multi-cloud network 100.

Deployment computer 108 may be distributed across private cloud network 104 including one or more datacenters and public cloud network 106 where private cloud network 104 and public cloud network 106 are bridged by a cloud service configured to integrate and virtualize various hierarchical layers of private cloud network 104 and public cloud network 106. Private cloud network 104 and public cloud network 106 comprise respective cloud gateways that translates cloud storage Application Programming Interfaces (APIs) to block-based storage protocols by using standard network protocols which integrate with existing applications within multi-cloud network 100.

Figure 2:
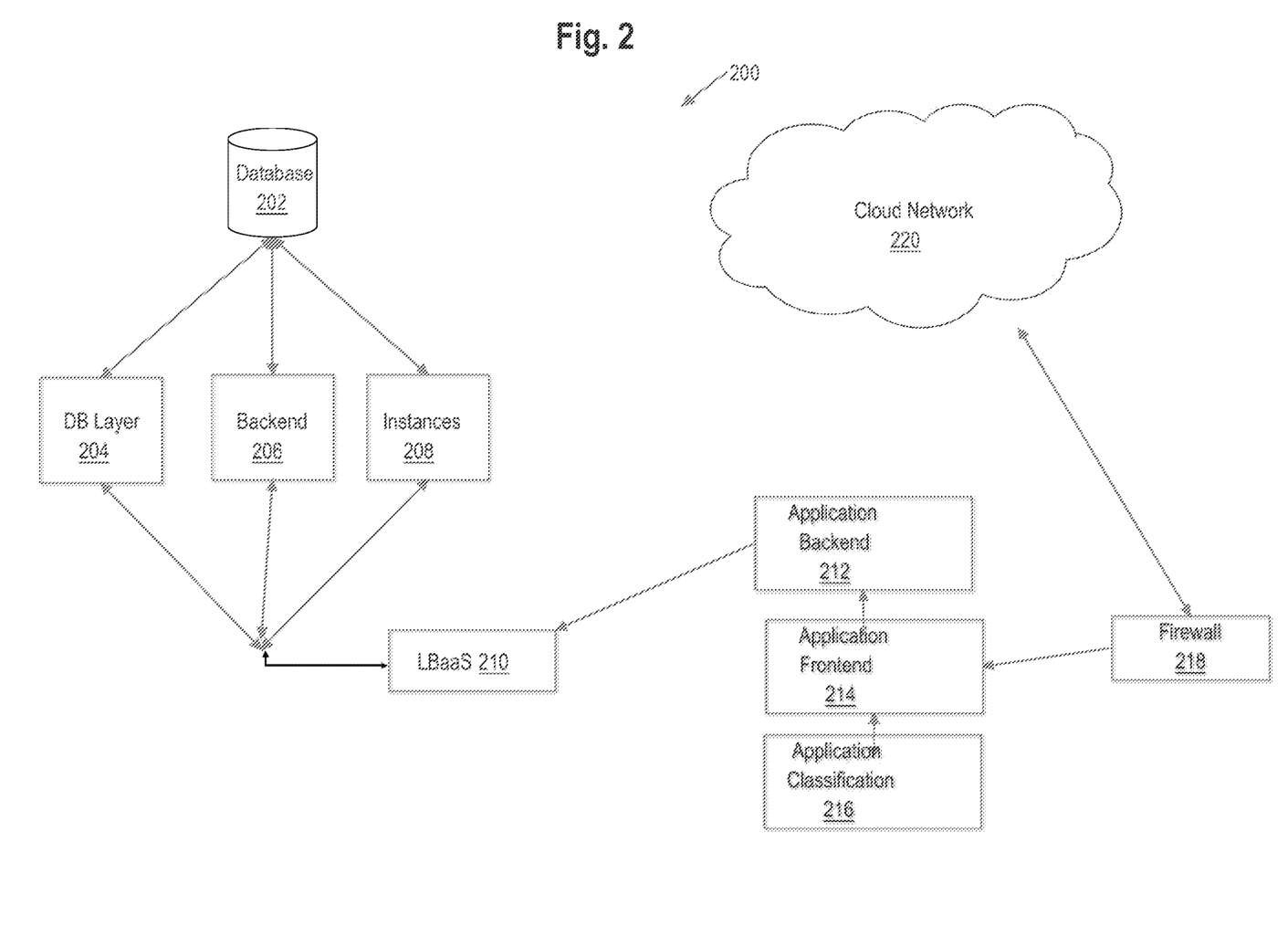
FIG. 2 illustrates a logical network model for a cloud computing deployment.

FIG. 2 depicts an overview diagram of a logical network model 200 in an embodiment. Logical model input 110 (FIG. 1) could specify or represent the logical network model 200, in one example embodiment.

In the example of FIG. 2, logical network model 200 includes database 202 comprising database layer 204, database backend 206, and database instances 208, load balancing-as-a-service (LBaaS) 210, application backend 212, application frontend 214, application classification 216, and firewall 218 all communicatively coupled over cloud network 220. A workload provided by an administrator or deployer of multi-cloud network 100 may use logical network model 200 in order to generate a physical realization of a network topology via deployment generation instructions 114. In logical network model 200, a user may connect to application frontend 214 to perform various operations such as L4-L7 processing. Application frontend 214 is configured to communicate with application backend 212, and LBaas 210 is configured to communicate with database 202 via database instances 208. Network functions are mapped and positioned to cloud network 220 via LBaas 210. In other embodiments, LBaas 210 can be positioned near database layer 204, database backend 206, and database instances 208.

Figure 3:
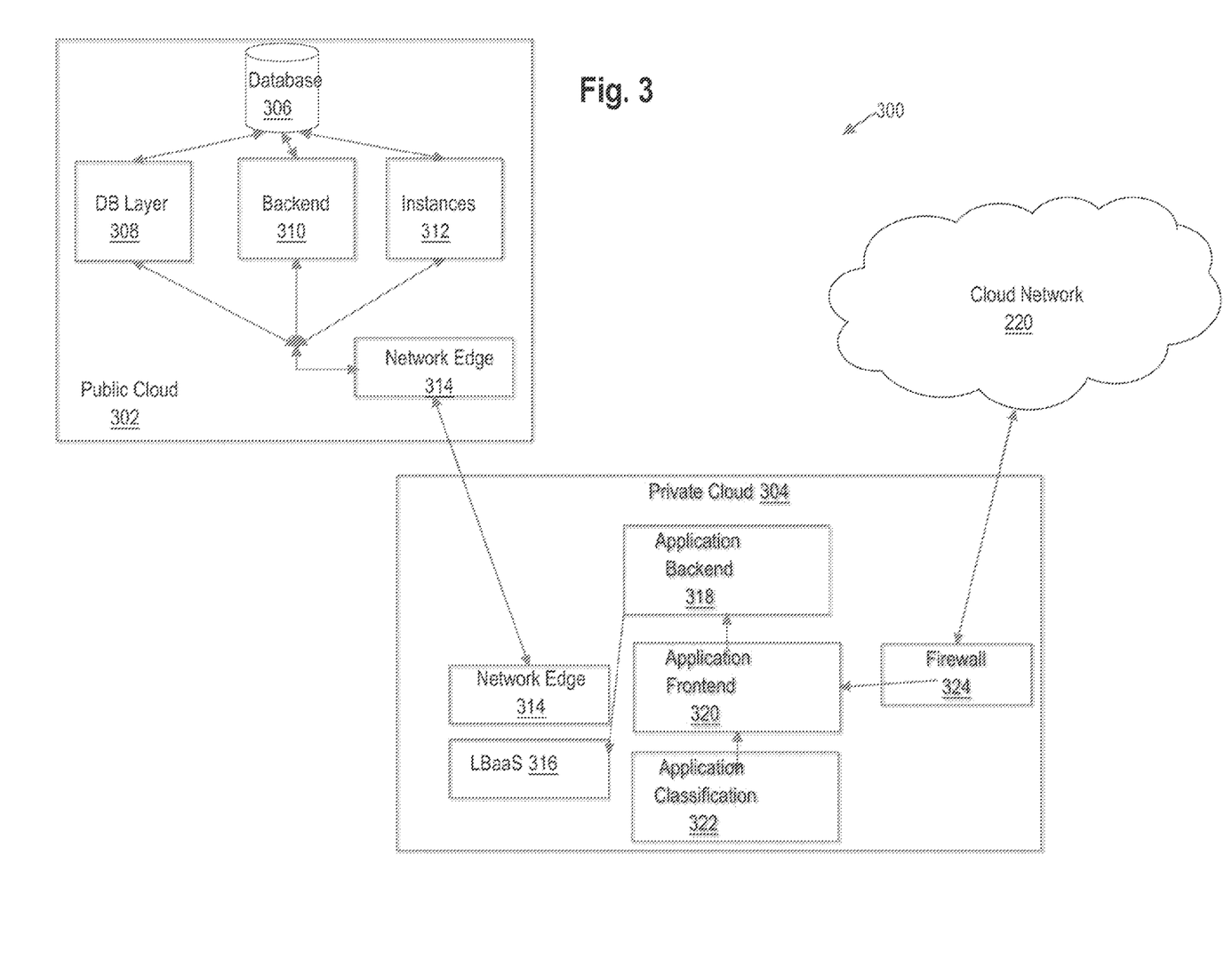
FIG. 3 illustrates an optimized network topology that has been generated by a deployment generator tool, according to an embodiment.

FIG. 3 depicts an optimized network topology that conforms to one or more constraints for one or more workloads and deployed within a multi-cloud network, according to an embodiment. In the example of FIG. 3, topology 300 represents an optimized reorganization of the topology 200 of FIG. 2, after processing using the optimization instructions 130 using constraint input 122.

Optimized network topology 300 includes public cloud 302, private cloud 304, database 306 comprising database layer 308, database backend 310, and database instances 312. Optimized network topology 300 further comprises network edge 314, load balancing-as-a-service (LBaaS) 316, application backend 318, application frontend 320, application classification 322, and firewall 324. The one or more constraints map network functions to private cloud 304 and cause LBaaS 316 to be positioned within the private cloud rather than being in front of the database layer backend instances. Network edge 314 may allow processing of data within multi-cloud network 100 by eliminating distance and time needed to send data. Edge, computing, and storage systems within public cloud 302 and private cloud 304 reside within network edge 314, which may be configured to remove processing latency associated with data sent from the edge of private cloud 302 and public cloud 304 to be processed in multi-cloud network 100.

The deployment generation instructions 114 may generate intermediate topologies or cause generating optimized topologies that are different in arrangement when generated at different times, based on changes in capacity and geography, which may be modeled as constraints. For example, a subsequent generation of an optimized topology could include elements in multiple different geographical regions rather than a single region. Or, at various times the deployment computer 108 may be programmed deploy a topology in a single region or multiple regions via hypervisors or any other software configured to perform virtualization or containerization.

Figure 4:
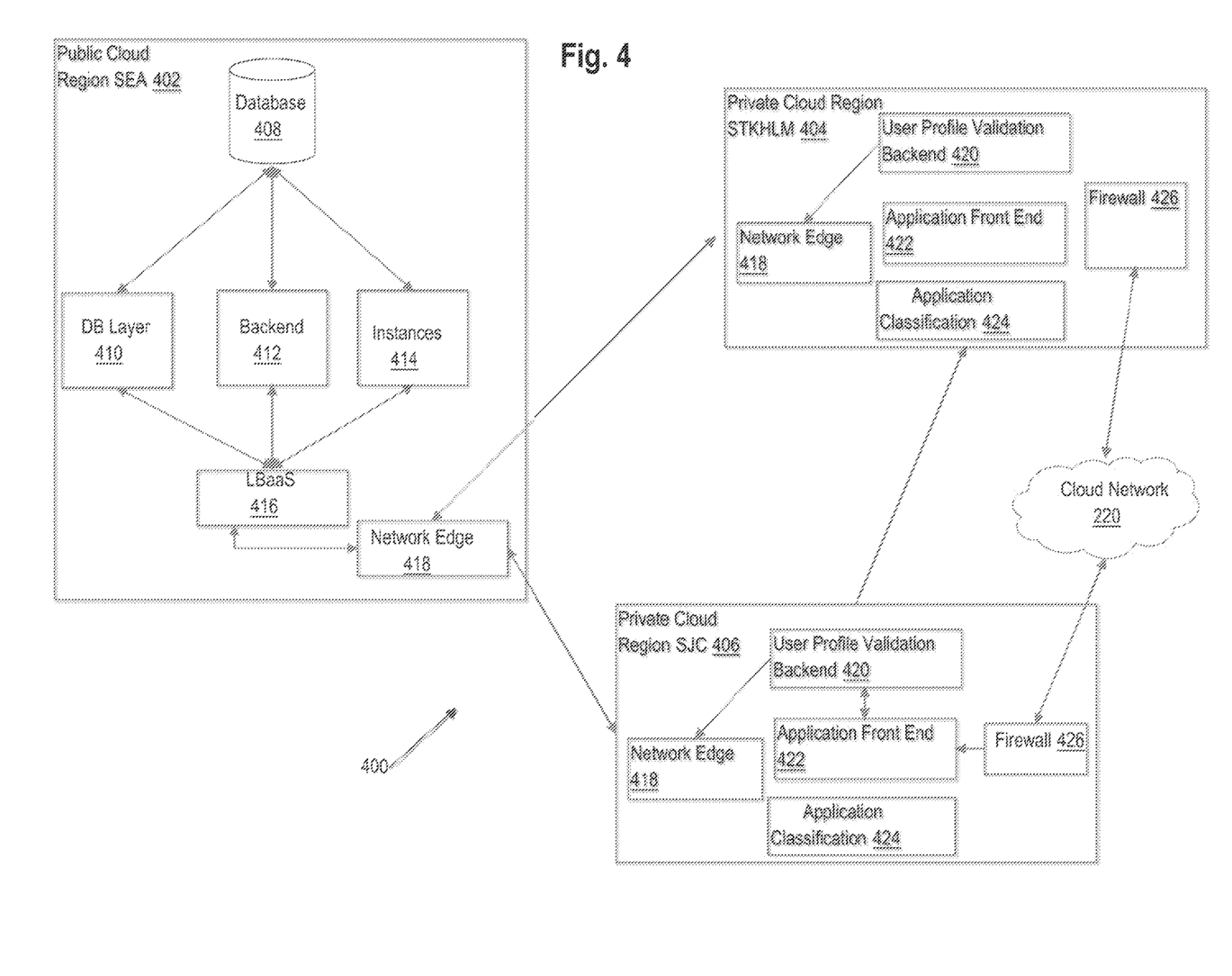
FIG. 4 illustrates another an optimized network topology generated by a deployment generator tool, according to another embodiment.

FIG. 4 depicts an optimized network topology illustrating effects of constraints such as network capacity and geography or locations of devices, databases or other elements.

For example, optimized network topology 400 includes public cloud region SEA 402, private cloud region STKHLM 404, private cloud region SJC 406, database 408 comprising database layer 410, database backend 412, and database instances 414. The designations SEA, STKHLM, SJC may refer to Seattle, Stockholm and San Jose, respectively, as examples of geographic distribution that could be used. Public cloud network 402 and private cloud networks 404, 406 further comprise network edge 418, load balancing-as-a-service (LBaaS) 416, application backend 420, application frontend 422, application classification 424, and firewall 426. Private clouds 404 and 406 may be positioned in various and distinct geographic locations but remain communicatively coupled to provide functions and services for deployment computer 108.

In the example of FIG. 4, with a new region, model equivalence checking using the deployment computer 108 of FIG. 1 results in placing the load balancer in the public cloud region SEA to enforce fairness of load balancing. Thus, compared to FIG. 3, in FIG. 4 the LBaaS 416 element is in a different physical position. While this is a simple example, more complex model equivalence checks and deployment processes may be programmed in embodiments.

As cloud networks are added to multi-cloud network 100, network model equivalence checks will progressively occur which results in some tools and components of the private cloud being transferred to the public cloud and vice versa. The reoccurring generating of network topologies and functional equivalence tests allow for the monitoring and addition of application endpoints to different private cloud regions and public clouds, which sparks transformations across cloud implementations and determines the placement of network functions within multi-cloud network 100.

In one embodiment, the deployment generation instructions 114 are configured to utilize cloud instance templates and architecture model specifications for all the tiers in the deployment which specifies the computing capacity for each tier.

Figure 5:
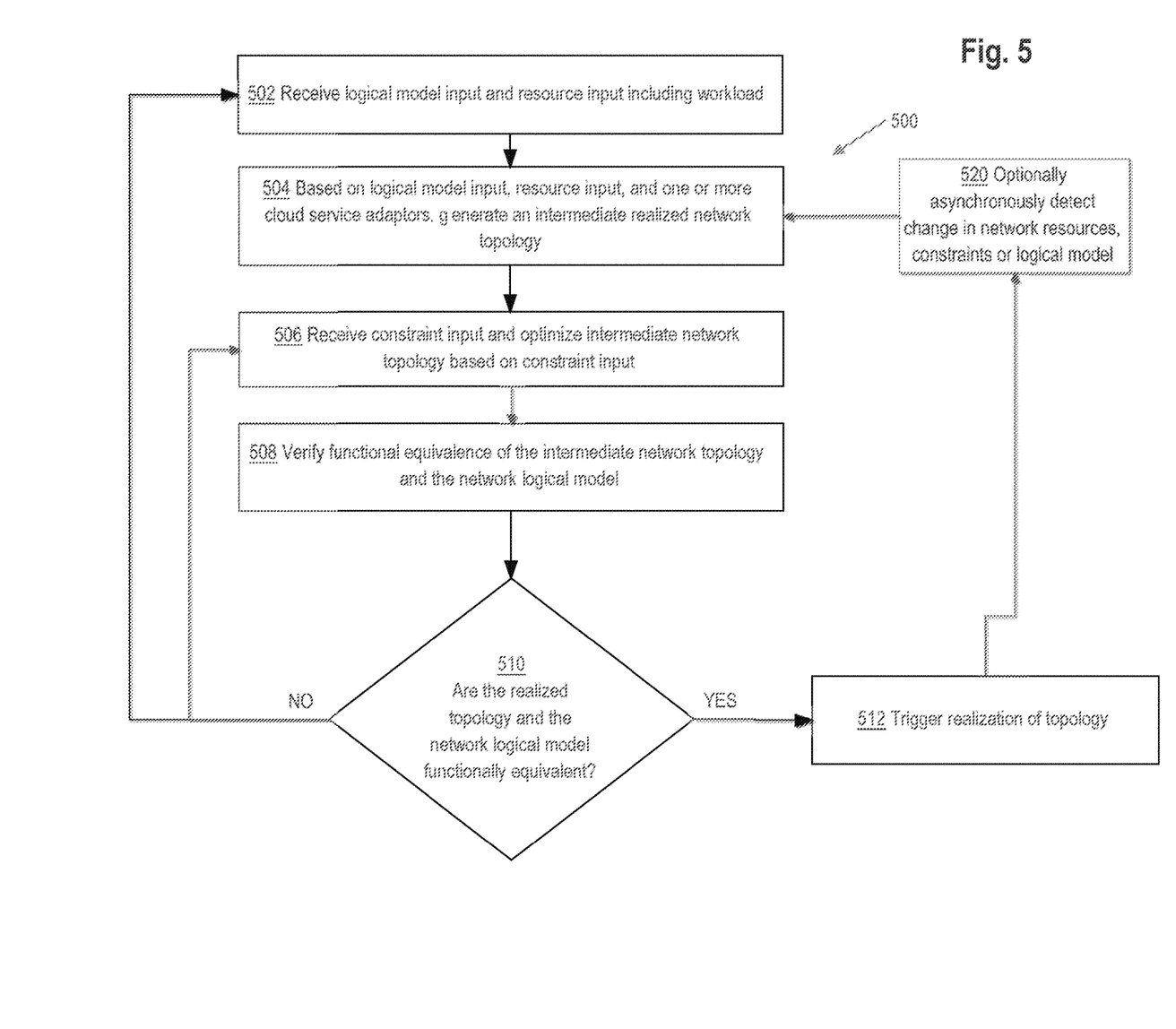
FIG. 5 illustrates the processing flow of a method for optimizing network functions in a multi-cloud system, in one embodiment.

FIG. 5 illustrates a process flow for generating an optimized network topology for a multi-cloud environment, in one embodiment. Process 500 may be performed by any generator that allows generating synthetic workloads for any cloud environment containing applications distributed across nodes in the cloud network. Process 500 may implement the functions of deployment computer 108 that have been described for FIG. 1.

In an embodiment, at block 502, the process receives logical network model input and resource input, which may include workload specifications. The logical network model specifies a multi-cloud network in terms of logical entities and not the physical placement of the entities in private cloud, public cloud or other specific resource locations.

At block 504, based on the logical model input, the resource input, and one or more cloud service adaptors, the process generates an intermediate realized network topology. The intermediate network topology may comprise a set of deployment instructions that could be transmitted to a private cloud network, public cloud network and combination to cause instantiation or spin-up of virtual machines, virtual routers or switches, load balancers, databases and other elements.

At block 506, the process receives constraint input and the intermediate topology is optimized to remap the topology to an optimized version of the topology that attempts to fulfill as many of the constraints as possible, generating a realized topology of multi-cloud network 100. For example, if the process receives a data model that includes multiple clouds in different geographic regions, then the process generates the optimized topology accounting for the components of the multiple clouds and repositions cloud components to accommodate the effect of the one or more constraints. The optimized version of the topology also may comprise a set of deployment instructions that could be transmitted to a private cloud network, public cloud network and combination to cause instantiation or spin-up of virtual machines, virtual routers or switches, load balancers, databases and other elements.

At block 508 and block 510, the process verifies functional equivalence of the intermediate network topology and the network logical model, and a test is performed to verify whether functional equivalence exists between the network logical model and the realized topology. If the optimized topology is not functionally equivalent to the network logical model that was originally received as input, then optimization against constraints may be re-performed at block 506; for example, different iterations of optimization at block 506 could involve using fewer or more constraints to test the minimum number of constraints necessary to produce a functionally equivalent topology. Or, control may transfer to block 502 at which updated model input and/or updated resource input including workload is/are received again. Blocks 502-510 can be performed repeatedly until functional equivalence between the generated topology and the network logical model is verified.

If the test of block 510 is true or positive, then at block 512, the process may trigger realization of the topology in a multi-cloud network. Triggering realization may comprise transmitting the instructions of the optimized network topology to public cloud resource configuration systems or private cloud resource configuration systems, uploading configuration files, transmitting instructions to instantiate virtual machines, or other electronic means of instructing a private cloud network or public cloud network to configure executable processes, virtual machines or physical machines to operate according to the optimized topology.

At block 520, the process optionally asynchronously detects a change in any of network resources, constraints or the logical model. If a change is detected, then the intermediate topology is re-generated in updated manner, optimized and validated prior to potential re-deployment or updated deployment. In an embodiment, the workflow of FIG. 5 is applied on any change that can potentially impact the network topology or network functions. Consequently, changes in constraints or resources can be applied to an existing logical network model to determine how to redeploy an equivalent physical topology in the network, for example.

3. Benefits of Certain Embodiments

The techniques described herein provide numerous benefits and improvements over existing techniques. In multi-cloud environments, a logical model is transformed to a realized network topology and is remapped to a functionally equivalent topology based on specified constraints. Constraints, in particular, may mandate the placement of certain high-capacity network functions in private cloud computing resources rather than using what would otherwise appear to be a more natural or logical position in a public cloud environment. Formal methods based on model checkers are used to calculate functional equivalence for the remapped transformation.

By utilizing formal model checking based approaches, the system is able to generate optimized network topologies that reflect updates, changes, and limitations provided by tools and components within multiple clouds in a network, allowing a broader spectrum of services/applications to run on private/on-premise clouds. Thus, the systems and methods described herein improve the functioning of the computing systems by generating optimized network topologies that accommodate hybrid/multi-cloud networks and their alterations, updates, and limitations.

4. Implementation Example—Hardware Overview

According to one embodiment, the techniques described herein are implemented by at least one computing device. The techniques may be implemented in whole or in part using a combination of at least one server computer and/or other computing devices that are coupled using a network, such as a packet data network. The computing devices may be hard-wired to perform the techniques, or may include digital electronic devices such as at least one application-specific integrated circuit (ASIC) or field programmable gate array (FPGA) that is persistently programmed to perform the techniques, or may include at least one general purpose hardware processor programmed to perform the techniques pursuant to program instructions in firmware, memory, other storage, or a combination. Such computing devices may also combine custom hard-wired logic, ASICs, or FPGAs with custom programming to accomplish the described techniques. The computing devices may be server computers, workstations, personal computers, portable computer systems, handheld devices, mobile computing devices, wearable devices, body mounted or implantable devices, smartphones, smart appliances, internetworking devices, autonomous or semi-autonomous devices such as robots or unmanned ground or aerial vehicles, any other electronic device that incorporates hard-wired and/or program logic to implement the described techniques, one or more virtual computing machines or instances in a data center, and/or a network of server computers and/or personal computers.

Figure 6:
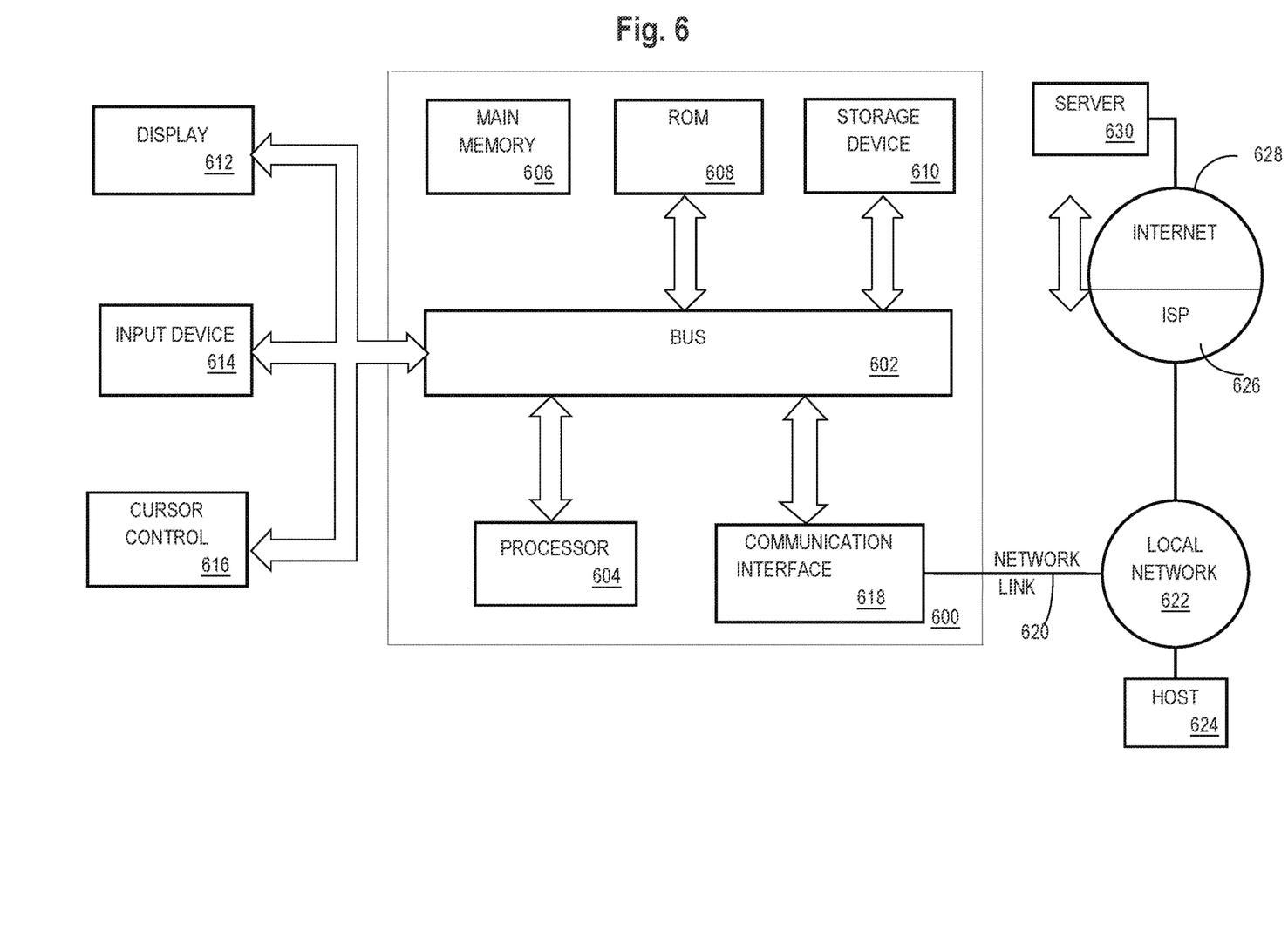
FIG. 6 is a block diagram that illustrates an example computer system with which an embodiment may be implemented.

FIG. 6 is a block diagram that illustrates an example computer system with which an embodiment may be implemented. In the example of FIG. 6, a computer system 600 and instructions for implementing the disclosed technologies in hardware, software, or a combination of hardware and software, are represented schematically, for example as boxes and circles, at the same level of detail that is commonly used by persons of ordinary skill in the art to which this disclosure pertains for communicating about computer architecture and computer systems implementations.

Computer system 600 includes an input/output (I/O) subsystem 602 which may include a bus and/or other communication mechanism(s) for communicating information and/or instructions between the components of the computer system 600 over electronic signal paths. The I/O subsystem 602 may include an I/O controller, a memory controller and at least one I/O port. The electronic signal paths are represented schematically in the drawings, for example as lines, unidirectional arrows, or bidirectional arrows.

At least one hardware processor 604 is coupled to I/O subsystem 602 for processing information and instructions. Hardware processor 604 may include, for example, a general-purpose microprocessor or microcontroller and/or a special-purpose microprocessor such as an embedded system or a graphics processing unit (GPU) or a digital signal processor or ARM processor. Processor 604 may comprise an integrated arithmetic logic unit (ALU) or may be coupled to a separate ALU.

Computer system 600 includes one or more units of memory 606, such as a main memory, which is coupled to I/O subsystem 602 for electronically digitally storing data and instructions to be executed by processor 604. Memory 606 may include volatile memory such as various forms of random-access memory (RAM) or other dynamic storage device. Memory 606 also may be used for storing temporary variables or other intermediate information during execution of instructions to be executed by processor 604. Such instructions, when stored in non-transitory computer-readable storage media accessible to processor 604, can render computer system 600 into a special-purpose machine that is customized to perform the operations specified in the instructions.

Computer system 600 further includes non-volatile memory such as read only memory (ROM) 608 or other static storage device coupled to I/O subsystem 602 for storing information and instructions for processor 604. The ROM 608 may include various forms of programmable ROM (PROM) such as erasable PROM (EPROM) or electrically erasable PROM (EEPROM). A unit of persistent storage 610 may include various forms of non-volatile RAM (NVRAM), such as FLASH memory, or solid-state storage, magnetic disk or optical disk such as CD-ROM or DVD-ROM and may be coupled to I/O subsystem 602 for storing information and instructions. Storage 610 is an example of a non-transitory computer-readable medium that may be used to store instructions and data which when executed by the processor 604 cause performing computer-implemented methods to execute the techniques herein.

The instructions in memory 606, ROM 608 or storage 610 may comprise one or more sets of instructions that are organized as modules, methods, objects, functions, routines, or calls. The instructions may be organized as one or more computer programs, operating system services, or application programs including mobile apps. The instructions may comprise an operating system and/or system software; one or more libraries to support multimedia, programming or other functions; data protocol instructions or stacks to implement TCP/IP, HTTP or other communication protocols; file format processing instructions to parse or render files coded using HTML, XML, JPEG, MPEG or PNG; user interface instructions to render or interpret commands for a graphical user interface (GUI), command-line interface or text user interface; application software such as an office suite, internet access applications, design and manufacturing applications, graphics applications, audio applications, software engineering applications, educational applications, games or miscellaneous applications. The instructions may implement a web server, web application server or web client. The instructions may be organized as a presentation layer, application layer and data storage layer such as a relational database system using structured query language (SQL) or no SQL, an object store, a graph database, a flat file system or other data storage.

Computer system 600 may be coupled via I/O subsystem 602 to at least one output device 612. In one embodiment, output device 612 is a digital computer display. Examples of a display that may be used in various embodiments include a touch screen display or a light-emitting diode (LED) display or a liquid crystal display (LCD) or an e-paper display. Computer system 600 may include other type(s) of output devices 612, alternatively or in addition to a display device. Examples of other output devices 612 include printers, ticket printers, plotters, projectors, sound cards or video cards, speakers, buzzers or piezoelectric devices or other audible devices, lamps or LED or LCD indicators, haptic devices, actuators or servos.

At least one input device 614 is coupled to I/O subsystem 602 for communicating signals, data, command selections or gestures to processor 604. Examples of input devices 614 include touch screens, microphones, still and video digital cameras, alphanumeric and other keys, keypads, keyboards, graphics tablets, image scanners, joysticks, clocks, switches, buttons, dials, slides, and/or various types of sensors such as force sensors, motion sensors, heat sensors, accelerometers, gyroscopes, and inertial measurement unit (IMU) sensors and/or various types of transceivers such as wireless, such as cellular or Wi-Fi, radio frequency (RF) or infrared (IR) transceivers and Global Positioning System (GPS) transceivers.

Another type of input device is a control device 616, which may perform cursor control or other automated control functions such as navigation in a graphical interface on a display screen, alternatively or in addition to input functions. Control device 616 may be a touchpad, a mouse, a trackball, or cursor direction keys for communicating direction information and command selections to processor 604 and for controlling cursor movement on display 612. The input device may have at least two degrees of freedom in two axes, a first axis (e.g., x) and a second axis (e.g., y), that allows the device to specify positions in a plane. Another type of input device is a wired, wireless, or optical control device such as a joystick, wand, console, steering wheel, pedal, gearshift mechanism or other type of control device. An input device 614 may include a combination of multiple different input devices, such as a video camera and a depth sensor.

In another embodiment, computer system 600 may comprise an internet of things (IoT) device in which one or more of the output device 612, input device 614, and control device 616 are omitted. Or, in such an embodiment, the input device 614 may comprise one or more cameras, motion detectors, thermometers, microphones, seismic detectors, other sensors or detectors, measurement devices or encoders and the output device 612 may comprise a special-purpose display such as a single-line LED or LCD display, one or more indicators, a display panel, a meter, a valve, a solenoid, an actuator or a servo.

When computer system 600 is a mobile computing device, input device 614 may comprise a global positioning system (GPS) receiver coupled to a GPS module that is capable of triangulating to a plurality of GPS satellites, determining and generating geo-location or position data such as latitude-longitude values for a geophysical location of the computer system 600. Output device 612 may include hardware, software, firmware and interfaces for generating position reporting packets, notifications, pulse or heartbeat signals, or other recurring data transmissions that specify a position of the computer system 600, alone or in combination with other application-specific data, directed toward host 624 or server 630.

Computer system 600 may implement the techniques described herein using customized hard-wired logic, at least one ASIC or FPGA, firmware and/or program instructions or logic which when loaded and used or executed in combination with the computer system causes or programs the computer system to operate as a special-purpose machine. According to one embodiment, the techniques herein are performed by computer system 600 in response to processor 604 executing at least one sequence of at least one instruction contained in main memory 606. Such instructions may be read into main memory 606 from another storage medium, such as storage 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage 610. Volatile media includes dynamic memory, such as memory 606. Common forms of storage media include, for example, a hard disk, solid state drive, flash drive, magnetic data storage medium, any optical or physical data storage medium, memory chip, or the like.

Storage media is distinct from but may be used in conjunction with transmission media. Transmission media participates in transferring information between storage media. For example, transmission media includes coaxial cables, copper wire and fiber optics, including the wires that comprise a bus of I/O subsystem 602. Transmission media can also take the form of acoustic or light waves, such as those generated during radio-wave and infra-red data communications.

Various forms of media may be involved in carrying at least one sequence of at least one instruction to processor 604 for execution. For example, the instructions may initially be carried on a magnetic disk or solid-state drive of a remote computer. The remote computer can load the instructions into its dynamic memory and send the instructions over a communication link such as a fiber optic or coaxial cable or telephone line using a modem. A modem or router local to computer system 600 can receive the data on the communication link and convert the data to a format that can be read by computer system 600. For instance, a receiver such as a radio frequency antenna or an infrared detector can receive the data carried in a wireless or optical signal and appropriate circuitry can provide the data to I/O subsystem 602 such as place the data on a bus. I/O subsystem 602 carries the data to memory 606, from which processor 604 retrieves and executes the instructions. The instructions received by memory 606 may optionally be stored on storage 610 either before or after execution by processor 604.

Computer system 600 also includes a communication interface 618 coupled to bus 602. Communication interface 618 provides a two-way data communication coupling to network link(s) 620 that are directly or indirectly connected to at least one communication networks, such as a network 622 or a public or private cloud on the Internet. For example, communication interface 618 may be an Ethernet networking interface, integrated-services digital network (ISDN) card, cable modem, satellite modem, or a modem to provide a data communication connection to a corresponding type of communications line, for example an Ethernet cable or a metal cable of any kind or a fiber-optic line or a telephone line. Network 622 broadly represents a local area network (LAN), wide-area network (WAN), campus network, internetwork or any combination thereof. Communication interface 618 may comprise a LAN card to provide a data communication connection to a compatible LAN, or a cellular radiotelephone interface that is wired to send or receive cellular data according to cellular radiotelephone wireless networking standards, or a satellite radio interface that is wired to send or receive digital data according to satellite wireless networking standards. In any such implementation, communication interface 618 sends and receives electrical, electromagnetic or optical signals over signal paths that carry digital data streams representing various types of information.

Network link 620 typically provides electrical, electromagnetic, or optical data communication directly or through at least one network to other data devices, using, for example, satellite, cellular, Wi-Fi, or BLUETOOTH technology. For example, network link 620 may provide a connection through a network 622 to a host computer 624.

Furthermore, network link 620 may provide a connection through network 622 or to other computing devices via internetworking devices and/or computers that are operated by an Internet Service Provider (ISP) 626. ISP 626 provides data communication services through a world-wide packet data communication network represented as internet 628. A server computer 630 may be coupled to internet 628. Server 630 broadly represents any computer, data center, virtual machine or virtual computing instance with or without a hypervisor, or computer executing a containerized program system such as DOCKER or KUBERNETES. Server 630 may represent an electronic digital service that is implemented using more than one computer or instance and that is accessed and used by transmitting web services requests, uniform resource locator (URL) strings with parameters in HTTP payloads, API calls, app services calls, or other service calls. Computer system 600 and server 630 may form elements of a distributed computing system that includes other computers, a processing cluster, server farm or other organization of computers that cooperate to perform tasks or execute applications or services. Server 630 may comprise one or more sets of instructions that are organized as modules, methods, objects, functions, routines, or calls. The instructions may be organized as one or more computer programs, operating system services, or application programs including mobile apps. The instructions may comprise an operating system and/or system software; one or more libraries to support multimedia, programming or other functions; data protocol instructions or stacks to implement TCP/IP, HTTP or other communication protocols; file format processing instructions to parse or render files coded using HTML, XML, JPEG, MPEG or PNG; user interface instructions to render or interpret commands for a graphical user interface (GUI), command-line interface or text user interface; application software such as an office suite, internet access applications, design and manufacturing applications, graphics applications, audio applications, software engineering applications, educational applications, games or miscellaneous applications. Server 630 may comprise a web application server that hosts a presentation layer, application layer and data storage layer such as a relational database system using structured query language (SQL) or no SQL, an object store, a graph database, a flat file system or other data storage.

Computer system 600 can send messages and receive data and instructions, including program code, through the network(s), network link 620 and communication interface 618. In the Internet example, a server 630 might transmit a requested code for an application program through Internet 628, ISP 626, local network 622 and communication interface 618. The received code may be executed by processor 604 as it is received, and/or stored in storage 610, or other non-volatile storage for later execution.

The execution of instructions as described in this section may implement a process in the form of an instance of a computer program that is being executed and consisting of program code and its current activity. Depending on the operating system (OS), a process may be made up of multiple threads of execution that execute instructions concurrently. In this context, a computer program is a passive collection of instructions, while a process may be the actual execution of those instructions. Several processes may be associated with the same program; for example, opening up several instances of the same program often means more than one process is being executed. Multitasking may be implemented to allow multiple processes to share processor 604. While each processor 604 or core of the processor executes a single task at a time, computer system 600 may be programmed to implement multitasking to allow each processor to switch between tasks that are being executed without having to wait for each task to finish. In an embodiment, switches may be performed when tasks perform input/output operations, when a task indicates that it can be switched, or on hardware interrupts. Time-sharing may be implemented to allow fast response for interactive user applications by rapidly performing context switches to provide the appearance of concurrent execution of multiple processes simultaneously. In an embodiment, for security and reliability, an operating system may prevent direct communication between independent processes, providing strictly mediated and controlled inter-process communication functionality.

What is claimed is:

1. A method comprising:
    receiving a first model that specifies a first logical topology of computing elements for deployment in a multi-cloud environment, the multi-cloud environment including a first cloud environment and a second cloud environment;
    receiving first inventory data that indicates a first availability of first computing elements in the first cloud environment;
    receiving second inventory data that indicates a second availability of second computing elements in the second cloud environment;
    receiving constraint data indicating a constraint on deployment of a computing element of the computing elements, the constraint indicating that the computing element is at least one of restricted from being deployed, or is to be deployed, on the first cloud environment;
    generating a second model that specifies a second logical topology of the computing elements using at least the first inventory data, the second inventory data, and the constraint data;
    determining that the second model is functionally equivalent to the first model at least partly using formal model checking.

2. The method of claim 1, wherein the second model comprises:
    a first set of deployment instructions configured for execution in the first cloud environment causing physical deployment of a first portion of a network deployment corresponding to the second model; and
    a second set of deployment instructions configured for execution in the second cloud environment causing physical deployment of a second portion of the network deployment corresponding to the second model.

3. The method of claim 2, further comprising:
    determining that the first model is functionally equivalent to the second model; and
    in response to determining that the first model is functionally equivalent to the second model:

transmitting the first set of deployment instructions to the first cloud environment; and transmitting the second set of deployment instructions to the second cloud environment.

4. The method of claim 1, wherein the constraint data specifies at least one attribute of the first cloud environment and at least one attribute of the second cloud environment.

5. The method of claim 1, further comprising:
deploying a network deployment across the first cloud environment and the second cloud environment according to the second model; and
detecting a change in at least one of network resources of the network deployment, the constraint data, the first inventory data, or the second inventory data; and
in response to detecting the change, generating a third model that specifies a third logical topology of the computing elements.

6. The method of claim 1, wherein determining that the second model is functionally equivalent to the first model is performed at least partly using partial order reduction model checking.

7. A method comprising:
receiving a first model that specifies a first logical topology of computing elements for deployment in a multi-cloud environment, the multi-cloud environment including a first cloud environment and a second cloud environment;
receiving first inventory data that indicates a first availability of first computing elements in the first cloud environment;
receiving second inventory data that indicates a second availability of second computing elements in the second cloud environment;
generating a second model that specifies a second logical topology of the computing elements using at least the first inventory data, the second inventory data, and the first model;
receiving constraint data indicating a constraint on deployment of a computing element of the computing elements, the constraint indicating that the computing element is at least one of restricted from being deployed, or is to be deployed, on the first cloud environment;
generating a third model that specifies a second logical topology of the computing elements using at least the constraint data and the second model; and
determining that the third model is functionality equivalent to at least one of the first model or the second model at least partly using formal model checking.

8. The method of claim 7, wherein the second model comprises:
a first set of deployment instructions configured for execution in the first cloud environment causing physical deployment of a first portion of a network deployment corresponding to the second model; and
a second set of deployment instructions configured for execution in the second cloud environment causing physical deployment of a second portion of the network deployment corresponding to the second model.

9. The method of claim 8, further comprising:
determining that the first model is functionally equivalent to the second model; and
in response to determining that the first model is functionally equivalent to the second model:
transmitting the first set of deployment instructions to the first cloud environment; and transmitting the second set of deployment instructions to the second cloud environment.

10. The method of claim 7, wherein the constraint data specifies at least one attribute of the first cloud environment and at least one attribute of the second cloud environment.

11. The method of claim 7, further comprising:
deploying a network deployment across the first cloud environment and the second cloud environment according to the second model; and
detecting a change in at least one of network resources of the network deployment, the constraint data, the first inventory data, or the second inventory data; and
in response to detecting the change, generating a third model that specifies a third logical topology of the computing elements.

12. The method of claim 7, wherein further comprising determining that the second model is functionally equivalent to the first model is performed using partial order reduction model checking.

13. The method of claim 7, wherein the first cloud environment is a private cloud environment and the second cloud environment is a public cloud environment.

14. A system comprising:
one or more processors; and
one or more non-transitory computer-readable media storing computer-executable instructions that, when executed by the one or more processors, cause the one or more processors to perform operations comprising:
receiving a first model that specifies a first logical topology of computing elements for deployment in a multi-cloud environment, the multi-cloud environment including a first cloud environment and a second cloud environment;
receiving first inventory data that indicates a first availability of first computing elements in the first cloud environment;
receiving second inventory data that indicates a second availability of second computing elements in the second cloud environment;
receiving constraint data indicating a constraint on deployment of a computing element of the computing elements, the constraint indicating that the computing element is at least one of restricted from being deployed, or is to be deployed, on the first cloud environment;
generating a second model that specifies a second logical topology of the computing elements using at least the first inventory data, the second inventory data, and the constraint data;
deploying a network deployment across the first cloud environment and the second cloud environment according to the second model; and
detecting a change in at least one of network resources of the network deployment, the constraint data, the first inventory data, or the second inventory data; and
in response to detecting the change, generating a third model that specifies a third logical topology of the computing elements.

15. The system of claim 14, wherein the second model comprises:
a first set of deployment instructions configured for execution in the first cloud environment causing physical deployment of a first portion of a network deployment corresponding to the second model; and
a second set of deployment instructions configured for execution in the second cloud environment causing physical deployment of a second portion of the network deployment corresponding to the second model.

16. The system of claim 15, the operations further comprising:
   determining that the first model is functionally equivalent to the second model; and
   in response to determining that the first model is functionally equivalent to the second model:
      transmitting the first set of deployment instructions to the first cloud environment; and
      transmitting the second set of deployment instructions to the second cloud environment.

17. The system of claim 14, wherein the constraint data specifies at least one attribute of the first cloud environment and at least one attribute of the second cloud environment.

18. The system of claim 14, the operations further comprising determining that the second model is functionally equivalent to the first model using partial order reduction model checking.

19. The system of claim 14, wherein the first cloud environment is a private cloud environment and the second cloud environment is a public cloud environment.

* * * * *